United States Patent
Dietrich et al.

(10) Patent No.: US 12,312,681 B2
(45) Date of Patent: May 27, 2025

(54) METHOD FOR SELECTIVE DEPOSITION OF DIAMOND COATINGS

(71) Applicant: Oerlikon Surface Solutions AG, Pfäffikon, Pfäffikon (CH)

(72) Inventors: Olaf Dietrich, Erkelenz (DE); Dirk Breidt, Erkelenz (DE)

(73) Assignee: OERLIKON SURFACE SOLUTIONS AG, PFÄFFIKON, Pfäffikon (CH)

( * ) Notice: Subject to any disclaimer, the term of this patent is extended or adjusted under 35 U.S.C. 154(b) by 224 days.

(21) Appl. No.: 18/256,986

(22) PCT Filed: Dec. 14, 2021

(86) PCT No.: PCT/EP2021/085764
§ 371 (c)(1),
(2) Date: Jun. 12, 2023

(87) PCT Pub. No.: WO2022/129095
PCT Pub. Date: Jun. 23, 2022

(65) Prior Publication Data
US 2024/0043991 A1 Feb. 8, 2024

(30) Foreign Application Priority Data
Dec. 14, 2020 (DE) ...................... 10 2020 133 403.6

(51) Int. Cl.
*C23C 16/27* (2006.01)
*C23C 16/02* (2006.01)
(Continued)

(52) U.S. Cl.
CPC .......... *C23C 16/27* (2013.01); *C23C 16/0272* (2013.01); *C23C 16/042* (2013.01); *C23C 28/046* (2013.01)

(58) Field of Classification Search
CPC ..... C23C 28/044; C23C 28/042; C23C 28/04; C23C 14/0611; C23C 16/27
See application file for complete search history.

(56) References Cited

U.S. PATENT DOCUMENTS 5,713,133 A    2/1998  Bhat et al.
6,096,377 A *  8/2000  Karner .................... C23C 16/27
                                                427/249.8

FOREIGN PATENT DOCUMENTS

CN          1102220 A       5/1995
CN        107675140 B       5/2019
(Continued)

OTHER PUBLICATIONS

Shakir et al, 2012 International Conf. May 21, 2022(2012) pp. 438-440. (Year: 2012).*
(Continued)

*Primary Examiner* — Tabassom Tadayyon Eslami
(74) *Attorney, Agent, or Firm* — Chrisman Gallo Tochtrop LLC

(57) ABSTRACT

A method for producing a selective diamond-coated substrate, wherein the diamond-coated substrate includes: a substrate having surfaces including cemented carbide material, areas selected to be coated, and areas not selected to be coated; and one or more diamond coatings on the areas selected to be coated, the method including following steps in order: a first masking step, wherein the areas not selected to be coated but could be chemically attacked during a chemical pre-treatment step, are masked by applying a latex-mask covering these areas; one or more chemical pre-treatment steps; a mask-removing step, wherein the latex-mask is removed; a second masking step, wherein the areas of the substrate surfaces from which the latex-mask was removed and not selected to be coated but could be coated with one or more diamond coatings during one or (Continued)

Figure 1:
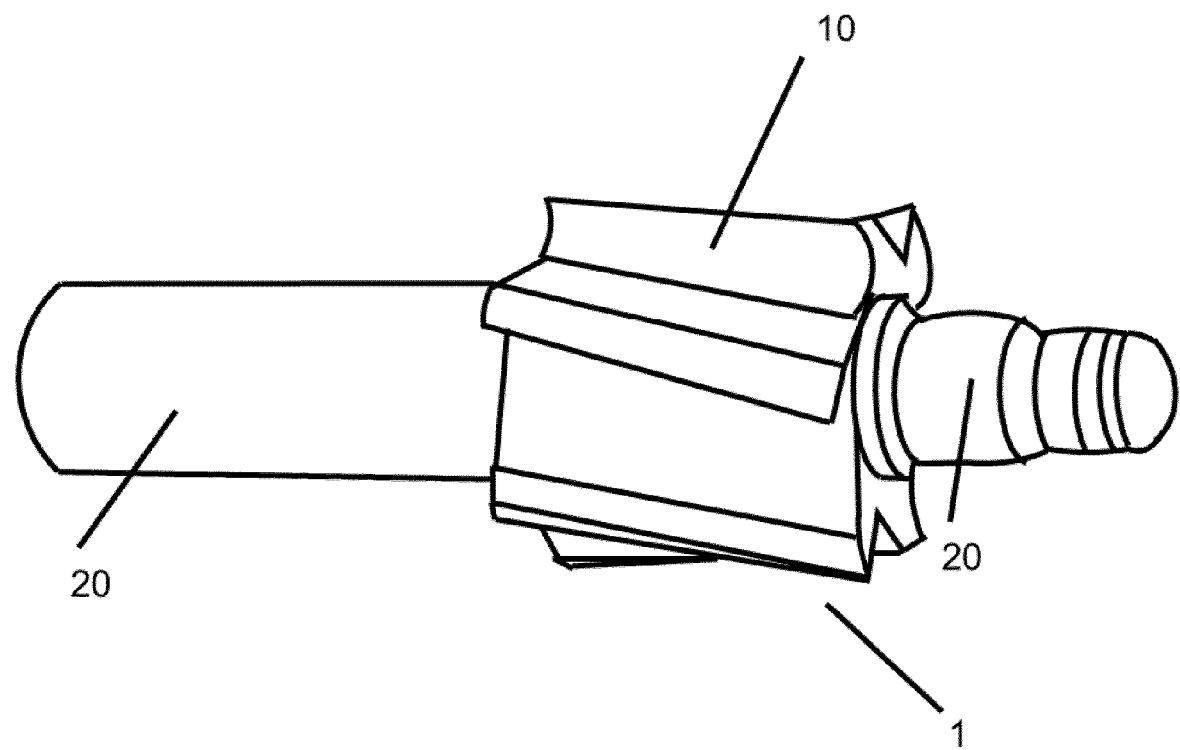

more coating steps, are covered with one or more masking-covers; and one or more coating steps.

8 Claims, 4 Drawing Sheets

(51) Int. Cl.
*C23C 16/04* (2006.01)
*C23C 28/04* (2006.01)

(56) References Cited

FOREIGN PATENT DOCUMENTS

| EP | 0528592 | * | 2/1993 |
| EP | 0528592 A1 | | 2/1993 |

OTHER PUBLICATIONS

International Search Report and Written Opinion issued in Application No. PCT/EP2021/085764 dated Apr. 7, 2022.

* cited by examiner

METHOD FOR SELECTIVE DEPOSITION OF DIAMOND COATINGS

The present invention relates to a method for obtaining a selective deposition of diamond coatings on a substrate, the method comprising a masking step, in which the areas of the substrate surfaces that are not selected to be coated but could be chemically attacked during conduction of the one or more chemical pre-treatments steps, are masked by applying a latex-mask in such a manner that the latex-mask cover the substrate material areas that need to be prevented from being affected by any chemical attacks.

A latex-mask in the context of the present invention is in particular a mask of a material comprising rubber or consisting of rubber.

In the context of the present invention, the latex-mask is a mask of a material that has resulted from the solidification of latex into rubber.

In the context of the present invention, for example natural latex (which comprises natural rubber) can be used for producing the latex-mask. However the invention is not only limited to the use of natural latex.

In general, the term "latex" can also be used for referring to dispersions comprising natural rubber or even for referring directly to natural rubber (in German language the term used for referring to "natural rubber" is: "Naturkautschuk" or simply "Kautschuk").

Sometimes in German speaking countries the word "Silikone" is used for referring to "Latex".

TECHNICAL FIELD AND STATE OF THE ART

For deposition of a diamond coating on a substrate of cemented carbide (also known as tungsten carbide), the substrate surface to be coated is usually chemically pre-treated by removing of Co binder (cobalt binder) from the WC—Co composite (composited of tungsten carbide and cobalt or mainly comprising tungsten carbide and cobalt) as it is for example described by Karner et al. in U.S. Pat. No. 6,096,377 A. After this step to ensure the growth of diamond coating and a sufficient adhesion in a coating deposition process the chemically pre-treated substrates are seeded, i.e. nucleated with diamond powder through friction contact, for example in an ultrasonic bath with a diamond powder suspension as it is for example mentioned by Karner et al. in U.S. Pat. No. 6,096,377 A.

Concretely the method described in U.S. Pat. No. 6,096,377 A relates to a process for coating substrates of sintered metal carbide (i.e. tungsten carbide sintered metal with Co bonding agent) with a diamond film, wherein the method can be realized as follows:
 Co etching,
 Tungsten carbide etching,
 Diamond powder nucleation,
 Diamond coating,
 or
 Tungsten carbide etching,
 Diamond powder nucleation,
 Co etching,
 Diamond coating,
 or
 Tungsten carbide etching
 Co etching
 Diamond powder nucleation
 Diamond coating In U.S. Pat. No. 6,096,377 A it is suggested furthermore to use a suitable chemical system for realizing the selective tungsten carbide etching and the selective Co etching, respectively. Such suitable chemical systems are for example mentioned in DE 19 522 372 A1.

In particular, for deposition of diamond coatings on cemented carbide substrates, e.g. cemented carbide tools, the surfaces of the substrate to be coated are usually chemically pre-treated at least for removing of Co binder from the cemented carbide material (hereafter also called WC—Co composite material). The cemented carbide substrates are usually immersed in an appropriate acid as well as alkaline solution for the conduction of the above mentioned chemical pre-treatment step and after this, the cemented carbide substrates are immersed in or exposed to a diamond powder suspension in an ultrasonic bath for a conduction of a seeding step.

DISADVANTAGES OF THE STATE OF THE ART

For conducting such kinds of pre-treatment step and seeding step, as well as for conducting subsequently the deposition of a diamond coating, there is a big challenge, when the substrates to be coated exhibit complex geometries and only some areas of the substrate surfaces (hereafter also called: selected areas or selected portions) are to be pre-treated and afterwards coated.

In such cases, in which the surfaces of the substrates to be coated should not be completely coated but selective coated, the above mentioned standard or conventional pre-treatment steps, seeding steps and coating methods cannot be accomplished in a simple manner.

In the context of the present description, the term "selective coated" will be used for referring to such cases, in which the surfaces of the substrate are only partially coated. In other words, only some selected areas (or some selected "portions") of the surfaces of the substrate are selected to be pre-treated and coated with diamond coatings.

OBJECTIVE OF PRESENT INVENTION

It is the objective of the present invention to at least partially avoid or overcome the aforementioned disadvantages, to provide a method for the deposition of diamond coatings that is ecologically and economically advantageous and furthermore to provide a method for making possible deposition of diamond coatings on selected substrate surfaces, without jeopardizing coating quality and also without damaging substrate surfaces that are not to be coated.

DESCRIPTION OF THE PRESENT INVENTION

The objective of the present invention is attained by providing a method for obtained a selective diamond-coated substrate as described below and as claimed in claim 1. Further features and details of the invention can be derived from the respective dependent claims, the description and the drawings.

The present invention provides a method for producing a selective diamond-coated substrate, wherein the selective diamond-coated substrate comprises:
 a substrate having surfaces comprising cemented carbide material and having areas of the substrate surfaces selected to be coated and areas of the substrate surfaces that are not selected to be coated, and
 one or more diamond coatings deposited on the areas of the substrate surfaces selected to be coated,
the method includes following steps:

one or more chemical pre-treatment steps, in which Co binder is removed from the cemented carbide material comprised in the substrate surfaces, and one or more coating steps, in which one or more diamond coatings are deposited on the areas of the substrate surfaces selected to be coated, wherein the method further includes following steps:

a first masking step, conducted before conducting the one or more chemical pre-treatment steps, wherein in the first masking step the areas of the substrate surfaces that are not selected to be coated but could be chemically attacked during conduction of the one or more chemical pre-treatments steps, are masked by applying a latex-mask covering these areas for avoiding any chemical attacks of the substrate material in these areas, mask-removing step, conducted after conducting the one or more chemical pre-treatments steps and before conducting the one or more coating steps, in which the latex-mask is completely removed, a second masking step conducted before conducting the one or more coating steps, wherein in the second masking step the areas of the substrate surfaces, from which the latex-mask was removed and are not selected to be coated but could be coated with one or more diamond coatings during conduction of the one or more coating steps, are covered with one or more masking-covers for avoiding deposition of any diamond coatings on these areas.

The masking covers can be made of any material that is suitable for conducting the diamond coating process, e.g. for conducting a diamond coating process by using chemical vapor deposition (CVD) techniques or plasma assisted chemical vapour deposition (PA_CVD) techniques. It means any material that does not negatively affect the coating process and the coating quality.

Preferably, the one or more masking-covers are made of copper and/or stainless steel, or are made of a material mainly comprising copper and/or stainless steel.

In other words, the present invention provides a method for attaining a selective area chemical pre-treatment and a selective area diamond deposition on substrates having complex geometries (hereafter also called complex geometry parts), in which the areas, which should not be chemically pre-treated and diamond-coated, are protected. The inventors were astonished with the very good results obtained by using the present inventive method.

The inventors think that the masking of areas of the substrate surfaces with a latex-mask according to the present invention, for avoiding undesirable chemical pre-treatment of these areas is very suitable and effective, because the latex-mask is pore free, watertight, does not react with chemical solutions used for conducting the above-mentioned chemical pre-treatments and can be easily removed (even easily by hand, with the fingers) after conduction of any chemical pre-treatment. Typical chemical solutions used in this context are for example the chemical solutions mentioned by Lee et al. in the patent document U.S. Pat. No. 5,700,518 A or also by Haubner et al. in the article "Murakami and $H_2SO_4/H_2O_2$ Pretreatment of WC—Co Hard Metal Substrates to Increase the Adhesion of CVD Diamond Coatings" published in: Journal de Physique IV Colloque, 1995, 05 (C5), pp. C5-753-C5-760. ff10.1051/jphyscol:1995589ff. ffjpa00253951.

Although diamond coatings do not adhere really good to the non-chemically pre-treated areas, and hence it could be possible to conduct the deposition of the diamond coating without masking these areas during diamond coating process, the inventors recommend covering of the non-chemically pre-treated areas with copper covers before conducting the diamond coating step or diamond coating steps because it considerably contributes to attain a better quality regarding well differentiation between diamond-coated areas and non-diamond-coated areas.

The advantage of using latex for producing the latex-mask used as masking material during chemical-pre-treatment and using copper as masking material during diamond coating, is that these materials show excellent masking effect without affecting the chemical pre-treatment process and the diamond deposition process, respectively. The inventors think it is because of the inertness of each one of this materials during each respective process.

The present inventive method is suitable to any variety of cemented carbide substrates (e.g. parts or components or tools made of cemented carbide or comprising surfaces to be diamond-coated made of cemented carbide or comprising cemented carbide), which could be coated with diamond coatings for different applications.

The substrate may comprise a mounting part, which is not to be coated with a diamond coating, and a non-mounting part, which is to be coated with a diamond coating. The mounting part may be configured to be mountable on a substrate holder, wherein the substrate holder is suited to hold a substrate in a coating step, in particular a chemical vapor deposition and/or or plasma assisted chemical vapor deposition process.

The cemented carbide material comprises Co binder (cobalt binder). In particular, the surface of the cemented carbide material comprises Co binder.

It is further conceivable that the latex-mask is applied by using natural latex. Natural latex has the advantage of being degradable by a wide range of bacteria, resulting in a lower ecological impact.

It can be provided that the natural latex is of the type: liquid natural latex, pre-vulcanized, having a solid fraction between 50 wt. % and 80 wt. %. Liquid natural latex can be easily processed. Pre-vulcanized latex further simplifies the handling, as usually, no maturation period is required. A solid fraction between 50 wt. % and 80 wt. % has been found to result in high quality, non-porous coatings that can easily be deposited and removed.

Advantageously, within the scope of the invention, it may be provided that the natural latex is free of ammoniac or comprises a low ammoniac fraction between 0.0 wt. % and 3 wt. %. A low ammoniac fraction between 0.0 wt. % and 3 wt. % provides the advantage of less serious pollution in comparison with higher fraction of ammoniac.

It is further conceivable that the ammoniac fraction is between 0.0 wt. % and 1 wt. %. A very low ammoniac fraction between 0.0 wt. % and 1 wt. % provides the advantage of a very low ecologic impact, while the stability of the latex is still ensured.

It can be provided that the one or more masking-covers (60) are made of copper and/or stainless steel; or are made of a material mainly comprising copper and/or stainless steel. Both materials provide the advantage the a diamond coating that is deposited on such a masking-cover peels off spontaneously during cooling after coating process because of the difference between the coefficients of expansion of the respective materials. This way, masks comprising or being made of copper and/or stainless steel do not affect the coating process and the quality of a diamond coating in a negative way.

Advantageously, within the scope of the invention, it may be provided that the substrate is a tool, in particular a hob cutter or a drilling tool, comprising a mounting part, the mounting part being formed as an area of the substrate surfaces that are not selected to be coated and suited to be mountable on a substrate holder for holding the substrate during the one or more coating steps and an active part, in particular teeth and/or a drill being formed as an area of the substrate surfaces selected to be coated wherein the active part is suited to provide a functionality of the tool, in particular cutting and/or drilling.

Further measures improving the invention result from the following description of some embodiments of the invention, which are shown schematically in the figures. All features and/or advantages arising from the claims, the description or the drawings, including constructional details, spatial arrangements and process steps, may be essential to the invention both individually and in a wide variety of combinations. It should be noted that the figures are descriptive only and are not intended to limit the invention in any way.

FIG. 1: Schematic representation of a hob 1 as substrate, with selected areas 10 of the substrate surfaces that are selected to be coated with a diamond coating, the selected areas comprising the teeth of the hob, and non-selected areas 20 of the substrate surfaces that are not selected to be coated with a diamond coating (in this case the non-selected areas are the so called mounting parts of the hob).

Figure 2:
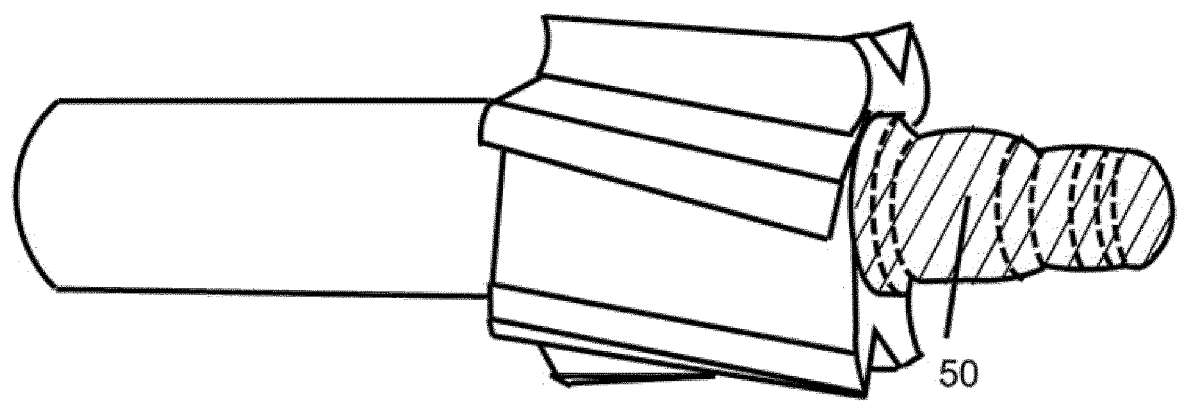

FIG. 2: Schematic representation of the hob 1 shown in FIG. 1, with a latex-mask 50 according to the present invention, covering one of the two non-selected areas 20 shown in FIG. 1, which is to be protected from any chemical attacks during conduction of a chemical pre-treatment.

Figure 3:
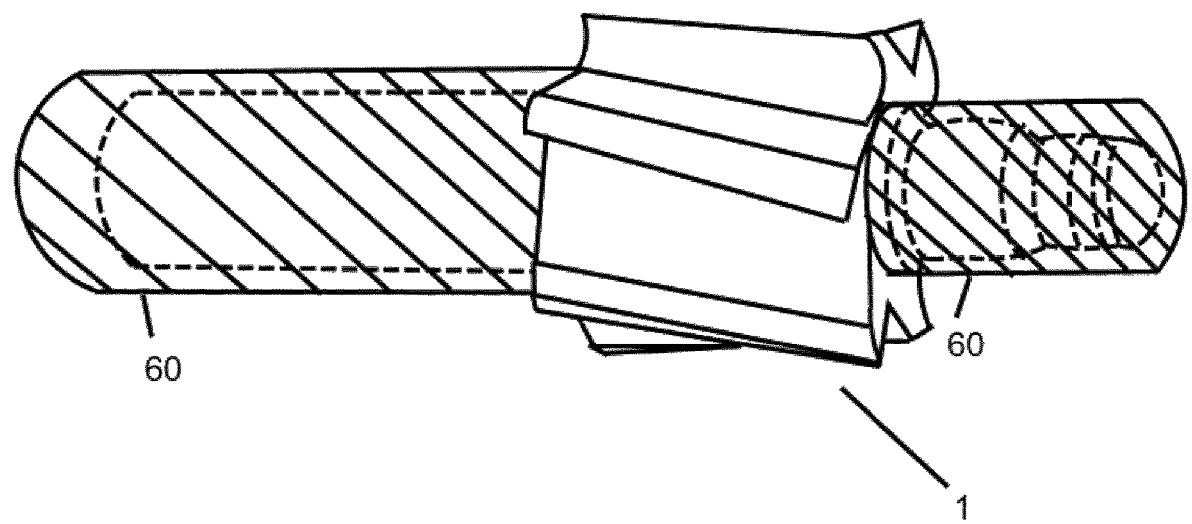

FIG. 3: Schematic representation of the hob 1 shown in FIG. 1, after removing the latex-mask 50 shown in FIG. 2, with two cooper covers 60 according to the present invention, covering the two non-selected areas 20 shown in FIG. 1, which are to be protected from being coated with a diamond coating during coating step.

Figure 4:
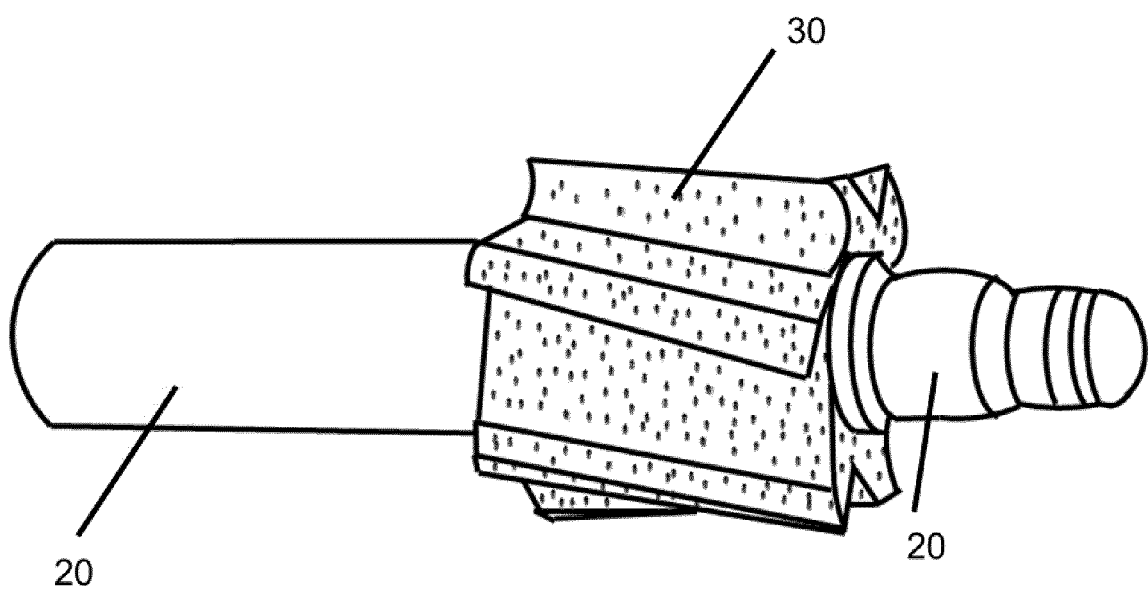

FIG. 4: Schematic representation of the hob 1 shown in FIG. 1, after conducting the coating step according to the present invention and after removing the cooper covers 60 shown in FIG. 3, the selective-coated hob 1 showing the selected area 10 shown in FIG. 1 coated with a diamond coating 30 and the non-selected areas 20 remaining without any effect of any chemical pre-treatment and also without any diamond coating deposited on them (i.e. showing selected areas 10 coated with diamond coating 30 and non-selected areas 20 remaining uncoated).

EXAMPLES OF A PROCEDURE FOR PRODUCING A SELECTIVE-COATED TOOL BY USING A METHOD ACCORDING TO THE PRESENT INVENTION

Inventive Example 1

As a showcase of the inventive method, a chemical pre-treatment process and afterwards a coating process for deposition of a diamond coating on selected areas of hob cutters with two-sides mounting parts (a such hob cutter with two-sides mounting parts is shown schematically in FIG. 1) was conducted as following:
 a). One of the two mounting parts 20 of the hob cutters 1, in this case exactly the mounting part that would be exposed to chemical pre-treatment together with the part comprising the teeth 10, was covered (masked) with a latex-mask consisting of natural latex, in some cases by applying natural latex on the above referred mounting part 20, by using a paintbrush, and in other cases by immersion of the above referred part 20 in a natural latex bad, following a drying process under normal ambient conditions (air atmosphere) for 24 hours.
 b). The above described step a). was repeated at least three times. The obtained latex-mask 50 (as schematically shown in FIG. 2) exhibited a smooth, uniform colored and pore free surface (visual appearance).
 c). The part of the hob cutters comprising the teeth (selected area 10) as well the mounting part masked with latex-mask were submerged in an acid solution commonly used for conducting a chemical pre-treatment for removing Co binder from the cemented carbide material comprised in the selected areas of the substrate surfaces that afterwards should be coated.
 d). The latex-masks were removed from the respective mounting parts of the hob cutters in an easy manner by hand.
 e). The part of the hob cutters comprising the teeth (selected area 10) as well the mounting part, from which the latex-masks were removed, were submerged in a diamond seeding bath for seeding the selected areas 10 of the substrate surfaces that were already chemical pre-treated as described in step c). and will be afterwards coated with a diamond coating.
 f). The hob cutters 1 after seeding step e). were mounted in a substrate holder in such a manner that both mounting parts were covered with cooper covers and the substrate holder was positioned inside of a CVD (chemical vapor deposition) coating chamber for conducting a diamond coating process.
 7. The diamond coating was deposited on the hob cutters, while the mounting parts 20 were covered with the cooper covers 60 as shown in FIG. 3.

Stripping of the diamond coating deposited on the cooper covers during coating process occurs spontaneously during cooling after coating process because of the difference between the coefficients of expansion of the respective materials: diamond (coating material) and copper (covers material). In this manner, the use of cooper covers during diamond coating process does not affect in any negative manner the coating process and also not the diamond coating quality.

The hob cutters were then selective-coated according to the present invention in such a manner that only the selected areas 10 were coated and the coating process and coating quality were not jeopardized.

Inventive Example 2

A similar procedure as described above in the inventive example 1, was used for producing selective-coated drilling tools.

In this case, the upper part of the function area of the drilling tools was the non-selected area, which should neither chemical pre-treated nor coated with a diamond coating, in order to avoid any influences on the stability of the upper drilling tools surface and also to avoid any influences on the geometry of the upper drilling tool surface, in particular for avoiding any undesirable reduction of the mechanical stability, in particular of the impact strength in the upper part of the drilling tools (including the drill bit).

Consequently, only the part of the drilling tools considered defining the final drilling tools diameter should be coated with a diamond coating, in order to increase the lifetime of the drilling tools.

Therefore, in this example the latex-mask was applied covering the drill bits of the drilling tools before conducting any chemical pre-treatment process for removing Co binder from the cemented carbide material forming the selected areas to be coated.

In similar manner, the latex-masks were mechanically removed after conducting the chemical pre-treatment processes.

The drilling tools were placed in cooper sleeves for covering the respective shafts of the drills and the drill bits were covered with respective cooper covers, in both cases for avoiding undesirable deposition of a diamond coating on the shafts or on the drill bits of the drilling tools during coating process.

For applying a latex-mask according to the present invention, the inventors recommend to use preferably natural latex for example of the type: liquid natural latex, pre-vulcanized, having a solid fraction (of natural rubber) between 50 wt. % and 80 wt. % (wt. %=in weight percentage), free of ammoniac or with low ammoniac fraction, preferably a fraction of ammoniac between 0.0 wt. % and 3 wt. %, more preferably between 0.0 wt. % and 1 wt. %. For example, in some of the inventive examples liquid natural latex, pre-vulcanized, having a solid fraction of 60 wt. % and ammoniac fraction of 0.3 wt. % was used for applying the latex-mask as mentioned above. The above-mentioned description, examples and figures are intended to be used to help to better understand the present invention and do not should be understand as a limitation of the present invention.

The foregoing explanation of the embodiments describes the present invention exclusively in the context of examples. Of course, individual features of the embodiments can be freely combined with each other, provided that this is technically reasonable, without leaving the scope of the present invention.

REFERENCE SIGNS

1 Substrate, Tool, Hob cutter
10 Selected Area, Teeth
20 Non-selected Area, Mounting Part
30 Diamond Coating
50 Latex Mask
60 Masking-cover, Copper Cover

What is claimed is:

1. A method for producing a selective diamond-coated substrate, wherein the selective diamond-coated substrate comprises:
   a substrate having surfaces comprising cemented carbide material and having areas of the substrate surfaces selected to be coated and areas of the substrate surfaces that are not selected to be coated, and
   one or more diamond coatings deposited on the areas of the substrate surfaces selected to be coated,
   the method including following steps:
   one or more chemical pre-treatment steps, in which Co binder is removed from the cemented carbide material comprised in the substrate surfaces, and
   one or more coating steps, in which one or more diamond coatings are deposited on the areas of the substrate surfaces selected to be coated,
   and wherein, the method further includes following steps:
   a first masking step, conducted before conducting the one or more chemical pre-treatment steps, wherein in the first masking step a latex mask is applied covering the areas of the substrate surfaces that are not selected to be coated but could be chemically attacked during conduction of the one or more chemical pre-treatments steps to avoid any chemical attacks of the substrate material on these areas,
   a mask-removing step, conducted after conducting the one or more chemical pre-treatments steps and before conducting the one or more coating steps, in which the latex-mask is completely removed,
   a second masking step conducted before conducting the one or more coating steps, wherein in the second masking step, a second mask is applied covering the areas of the substrate surfaces from which the latex-mask was removed and are not selected to be coated but could be coated with one or more diamond coatings during conduction of the one or more coating steps for avoiding deposition of any diamond coatings on these areas.

2. A method according to claim 1, wherein the one or more masking-covers are made of copper and/or stainless steel; or are made of a material mainly comprising copper and/or stainless steel.

3. A method according to claim 1, wherein the substrate is a tool, comprising:
   a mounting part, the mounting part being formed as an area of the substrate surfaces that are not selected to be coated and suited to be mountable on a substrate holder for holding the substrate during the one or more coating steps;
   an active part formed as an area of the substrate surfaces selected to be coated, wherein the active part is configured to provide a functionality of the tool.

4. A method according to claim 3 wherein the substrate is configured to be a hob cutter or a drilling tool, the active part is configured as teeth and/or a drill, and the active part is configured for cutting and/or drilling.

5. A method according to claim 1, wherein the latex-mask is applied by using natural latex.

6. A method according to claim 5, wherein the natural latex is a liquid natural latex, pre-vulcanized, having a solid fraction between 50 wt. % and 80 wt. %.

7. A method according to claim 6, wherein the natural latex is free of ammoniac or comprises a low ammoniac fraction between 0.0 wt. % and 3 wt. %.

8. A method according to claim 7, wherein the ammoniac fraction is between 0.0 wt. % and 1 wt. %.

* * * * *